US012087590B2

(12) United States Patent
Kung et al.

(10) Patent No.: US 12,087,590 B2
(45) Date of Patent: Sep. 10, 2024

(54) SELF-HEALING POLISHING PAD

(71) Applicant: Taiwan Semiconductor Manufacturing Co., Ltd., Hsinchu (TW)

(72) Inventors: Chun-Hao Kung, Hsinchu (TW); Hui-Chi Huang, Zhubei (TW); Kei-Wei Chen, Tainan (TW); Yen-Ting Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/066,934

(22) Filed: Dec. 15, 2022

(65) Prior Publication Data

US 2023/0118617 A1    Apr. 20, 2023

Related U.S. Application Data

(62) Division of application No. 16/513,664, filed on Jul. 16, 2019, now Pat. No. 11,551,936.

(60) Provisional application No. 62/712,900, filed on Jul. 31, 2018.

(51) Int. Cl.
*H01L 21/306*    (2006.01)
*B24B 37/24*    (2012.01)
*H01L 21/321*    (2006.01)

(52) U.S. Cl.
CPC ........ *H01L 21/30625* (2013.01); *B24B 37/24* (2013.01); *H01L 21/3212* (2013.01)

(58) Field of Classification Search
CPC ........... H01L 21/30625; H01L 21/3212; B24B 37/24; B24B 49/12; B24B 53/017; B24B 37/26
USPC ................................................... 438/690–693
See application file for complete search history.

(56) References Cited

U.S. PATENT DOCUMENTS

| | | | |
|---|---|---|---|
| 5,965,460 A | * | 10/1999 | Rach .................... C08G 18/672 451/526 |
| 2005/0098540 A1 | * | 5/2005 | Prasad ................... B24B 37/22 216/88 |
| 2006/0068088 A1 | | 3/2006 | Jeong et al. |
| 2006/0125133 A1 | | 6/2006 | Huh et al. |
| 2013/0252519 A1 | | 9/2013 | Daskiewich |
| 2020/0205560 A1 | | 7/2020 | Daskiewich et al. |

OTHER PUBLICATIONS

Translation of KR 20070021930A (Year: 2007).*

* cited by examiner

*Primary Examiner* — Duy Vu N Deo
(74) *Attorney, Agent, or Firm* — Seed IP Law Group LLP

(57) ABSTRACT

Provided herein are polishing pads in which microcapsules that include a polymer material and are dispersed, as well as methods of making and using the same. Such microcapsules are configured to break open (e.g., when the polishing pad is damaged during the dressing process), which releases the polymer material. When contacted with ultraviolet light the polymer material at least partially cures, healing the damage to the polishing pad. Such polishing pads have a longer lifetime and a more stable remove rate when compared to standard polishing pads.

20 Claims, 10 Drawing Sheets

SELF-HEALING POLISHING PAD

PRIORITY CLAIM AND CROSS-REFERENCE

This application is a divisional application of U.S. application Ser. No. 16/513,664, filed Jul. 16, 2019, which claims the priority of U.S. Provisional Patent Application No. 62/712,900, filed Jul. 31, 2018, all of which are incorporated herein by reference in their entireties.

BACKGROUND

Chemical Mechanical Polishing (CMP) is a common practice in the formation of integrated circuits. Typically, CMP is used for the planarization of semiconductor wafers. CMP takes advantage of the combined effect of both physical and chemical forces for the polishing of wafers. It is performed by applying a load force to the back of a wafer while the wafer rests on a polishing pad. A polishing pad is placed against the wafer. The polishing pad and the wafer are then counter-rotated while a slurry containing abrasives and/or reactive chemicals is passed therebetween. CMP is an effective way to achieve global planarization of wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
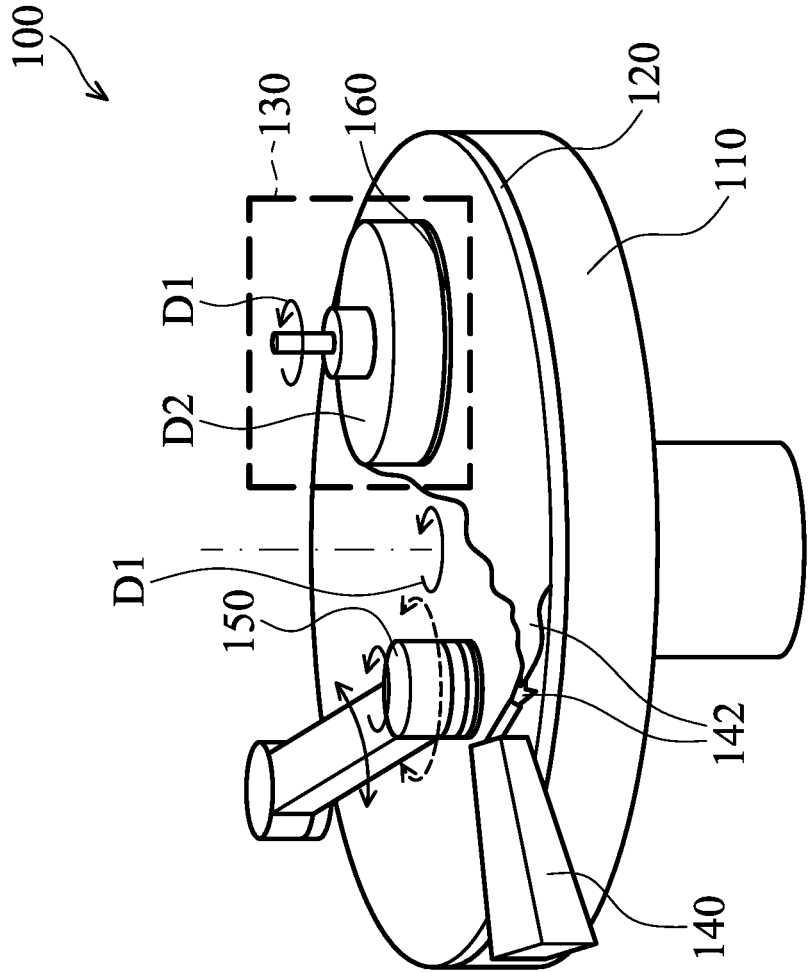
FIG. 1 is a perspective view of a chemical-mechanical polishing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A self-healing polishing pad is provided in accordance with various exemplary embodiments. The self-healing polishing pad includes a plurality of microcapsules, which contain a polymer material, arranged in the polishing pad, as well as methods of making and using the same. The present disclosure further provides a Chemical Mechanical Polishing (CMP) apparatus that includes such a self-healing polishing pad (also referred to throughout as "polishing pad") in accordance with various embodiments. Variations of some embodiments are discussed. The embodiments of the present disclosure also include the scope of using the CMP apparatus in accordance with the embodiments to manufacture integrated circuits. For example, the CMP apparatus is used to planarize wafers, in which integrated circuits are formed.

FIG. 1 schematically illustrates a perspective view of a portion of a chemical-mechanical polishing system 100 according to some embodiments of the present disclosure. As shown in FIG. 1, the chemical-mechanical polishing system 100 includes a platen 110, a polishing pad 120, a polishing head 130, a slurry dispenser 140, and a disk 150. The polishing pad 120 is arranged on the platen 110. The slurry dispenser 140, the polishing head 130, and the disk 150 are present above the polishing pad 120.

The polishing pad 120 is formed of a material that is hard enough to allow abrasive particles in the slurry to mechanically polish wafer 160, which is between the polishing head 130 and the polishing pad 120. On the other hand, polishing pad 120 is soft enough so that it does not substantially scratch the wafer 160 during the polishing process.

During the CMP process, the platen 110, which is rotated by a mechanism such as a motor (not shown), in turn rotates polishing pad 120 in a direction D1. The polishing head 130 may push a wafer 160 in a direction D2 against the polishing pad 120, such that the side of the wafer 160 in contact with the polishing pad 120 may be polished by the slurry 142.

For further planarization of the wafer 160, the polishing head 130 may rotate (e.g., in the direction D1, as shown or the reverse direction), causing the wafer 160 to rotate, and move on the polishing pad 120 at the same time, but various embodiments of the present disclosure are not limited in this regard. In accordance with some embodiments of the present disclosure, as shown in FIG. 1, polishing head 130 and polishing pad 120 rotate in the same direction (e.g., clockwise or counter-clockwise). In accordance with alternative embodiments, polishing head 130 and polishing pad 120 rotate in opposite directions.

While the CMP apparatus 100 is in operation, slurry 142 flows between wafer 160 and polishing pad 120. The slurry dispenser 140, which has an outlet over the polishing pad 120, is used to dispense slurry 142 onto the polishing pad 120. The slurry 142 includes reactive chemical(s) that react with the surface layer of the wafer 160 and abrasive particles for mechanically polishing the surface of the wafer 160. Through the chemical reaction between the reactive chemical(s) in the slurry and the surface layer of wafer 160, and the mechanical polishing, the surface layer of wafer 160 is removed.

As the polishing pad is used, pores in the surface of the polishing pad become clogged and the surface of the polishing pad tends to flatten. This drastically reduces the material removal ability of the polishing surface (e.g., the removal rate and overall efficiency) and is referred to as glazing.

Disk 150 is arranged over polishing pad 120, and is configured to be used to condition polishing pad 120 and to remove undesirable by-products generated during the CMP process. Disk 150 generally has protrusions or cutting edges that can be used to polish and re-texturize the surface of the polishing pad by strategically damaging the polishing surface during a dressing process. In accordance with some embodiments of the present disclosure, disk 150 contacts the top surface of polishing pad 120 when polishing pad 120 is to be conditioned. During the conditioning process, the polishing pad 120 and disk 150 are rotated, so that the protrusions or cutting edges of the disk 150 move relative to the surface of polishing pad 120, to polish and re-texturize the surface of the polishing pad 120.

Figure 2A:
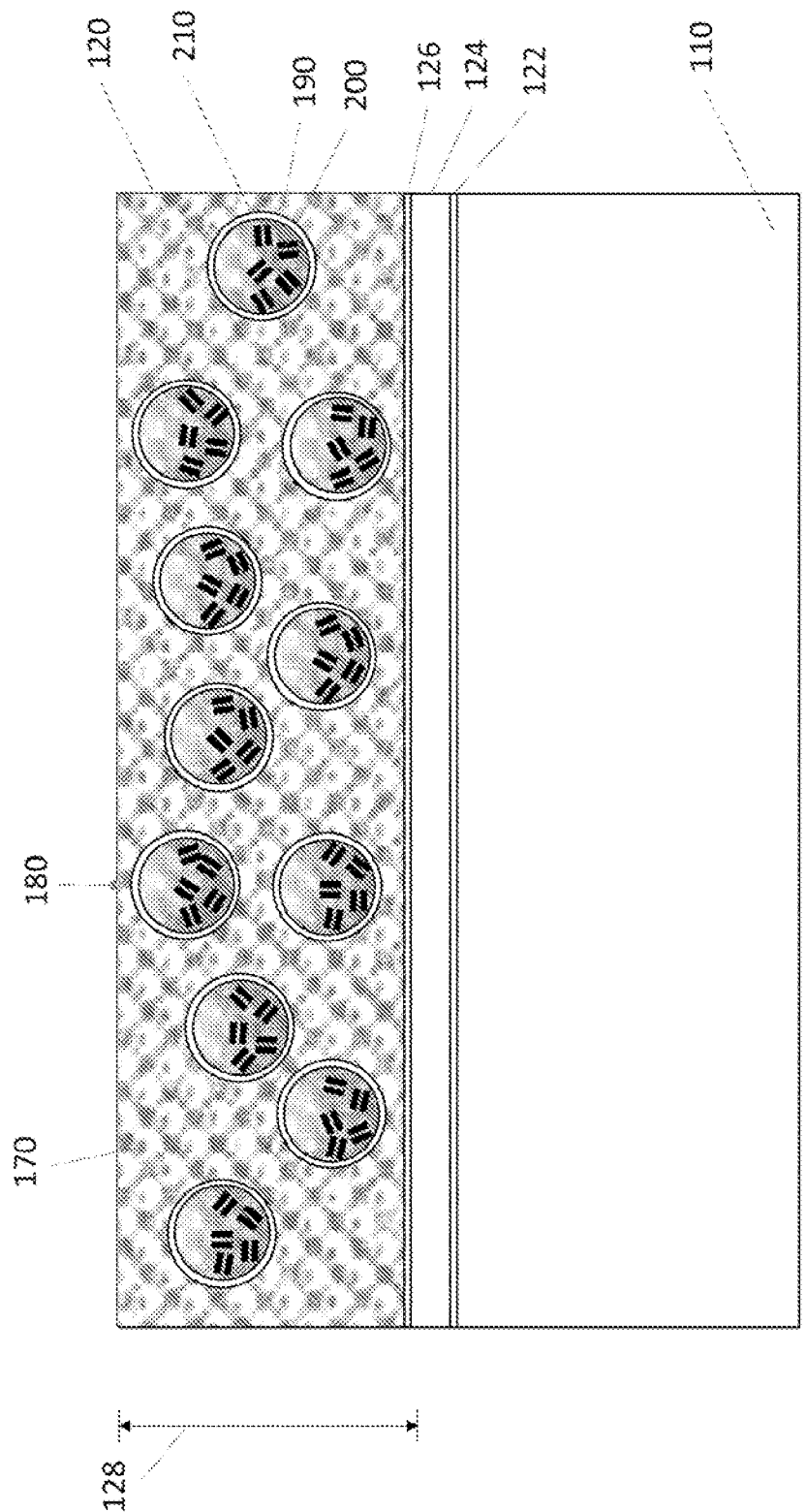
FIGS. 2A-2D are cross-sectional views of a portion of a chemical-mechanical polishing apparatus including a polishing pad of the present disclosure at various stages during use, in accordance with some embodiments.

FIGS. 2A-2D illustrate cross-sectional views of a polishing pad of the present disclosure in various stages of use. FIG. 2A is a cross-sectional view of a polishing pad of the present disclosure before use. As shown in FIG. 2A, polishing pad 120 is arranged on platen 110.

Polishing pad 120 includes a first adhesive layer 122 that couples the platen 110 to the remainder of the polishing pad 120, a sub pad 124, a second adhesive layer 126, and a top pad 170 of a porous material (e.g., a porous polymeric material). In embodiments, the polishing pad 120 has a nap thickness 128 of at least 0.5 millimeters (mm). In some embodiments, the polishing pad 120 has a nap thickness 128 of no more than 3 mm. In particular embodiments, the polishing pad 120 has a nap thickness 128 ranging from about 0.5 mm to about 3 mm.

A plurality of microcapsules 180 are embedded in the porous material of the top pad 170. In other words, the top pad 170 is a matrix of material (e.g., polymeric material) in which a plurality of microcapsules is dispersed. Each microcapsule 180 includes a mixture of a polymer material 190 and a photoinitiator 200, which is surrounded by a shell 210.

Accordingly, embodiments of the present disclosure include a polishing pad comprising a matrix of polymeric material; and a plurality of microcapsules dispersed in the matrix of polymeric material, each microcapsule of the plurality of microcapsules comprising a mixture comprising a polymer material and a photoinitiator; and a shell around the mixture.

Any suitable material can be used for the shell of the microcapsules, as long as it is able to maintain its shape and has functional characteristics (e.g., strength and flexibility) that are within the desired range. In other words, any material that provides a shell that is strong and flexible enough such that the microcapsule shell does not break during normal polishing of a wafer, but weak and brittle enough that the microcapsule shell breaks during the dressing process. In some embodiments, the shell 210 material includes an oxide. In some embodiments, the oxide is a metal oxide. In various embodiments, the shell 210 includes $SiO_2$, $Al_2O_3$, $TiO_2$, or a combination thereof.

Additionally, the shell material can be chosen based on the type of CMP process in which the resulting polishing pad will be used (e.g., metal or non-metal CMP, slurry abrasive type, etc.). As the shell will be broken by abrasive mechanical force during the CMP process, the shell material can be chosen such that the Mohs hardness of the slurry abrasive is equal to or greater than the Mohs hardness of the shell material. In various embodiments, the Mohs hardness of the slurry abrasive is at least 0.5 times higher than the Mohs hardness of the shell material. In embodiments of a polishing pad to be used in a non-metal CMP process (e.g., oxide, nitride, polysilicon, etc., CMP), the microcapsules include a shell of $SiO_2$. In another embodiment, in which the polishing pad will be used in a metal CMP process (e.g., copper, tungsten, aluminum, etc., CMP), the microcapsules include a shell of $SiO_2$, $Al_2O_3$, or $TiO_2$. In embodiments, in which the polishing pad is to be used with a silica slurry abrasive, the microcapsules include a shell of silicon dioxide. In other embodiments, in which the polishing pad is to be used with an alumica slurry abrasive, the microcapsules include a shell of alumina. In further embodiments, in which the polishing pad is to be used with a ceria slurry abrasive, the microcapsules include a shell of a ceria-based material. As is understood, suitable shell materials are not limited to those listed herein, and any suitable shell material could be used in the microcapsules of the disclosure.

The thickness of the shell of the microcapsule can be any suitable thickness, as long as it is thick enough such that the microcapsule shell does not break during normal polishing of a wafer and thin enough such that the microcapsule shell breaks during the dressing process. The thickness of the shell can be chosen based at least on several factors, such as the type of CMP, the pad thickness, the overall microcapsule size, and the like. In embodiments, the thickness of the shell is at least 2 μm. In some embodiments, the thickness of the shell is no more than 5 μm. In particular embodiments, the thickness of the shell ranges from about 2 μm to about 5 μm.

Any suitable polymer material can be used in the microcapsules. In general, the polymer material in the microcapsules will be chosen based at least in part on the polymeric material of the top pad. In other words, the polymer material in the microcapsules, once polymerized will be chemically similar to, if not identical to, the polymeric material of the top pad according to embodiments of the present disclosure. However, in some embodiments, the polymer material, when polymerized, will not be similar to the polymeric material of the top pad.

In some embodiments, the polymer material includes one or more monomers, oligomers, polymers, or a combination thereof. Suitable polymer materials include monomers, oligomers, and polymers that include the following structures:

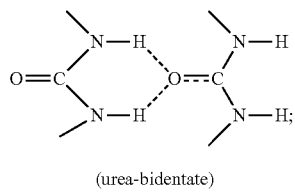

(urea-bidentate)

-continued

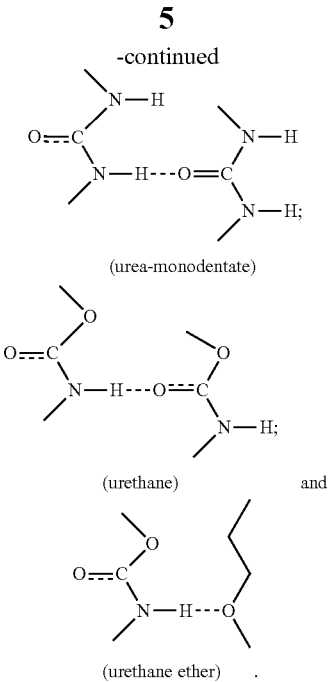

(urea-monodentate)

(urethane) and (urethane ether).

Figure 3:
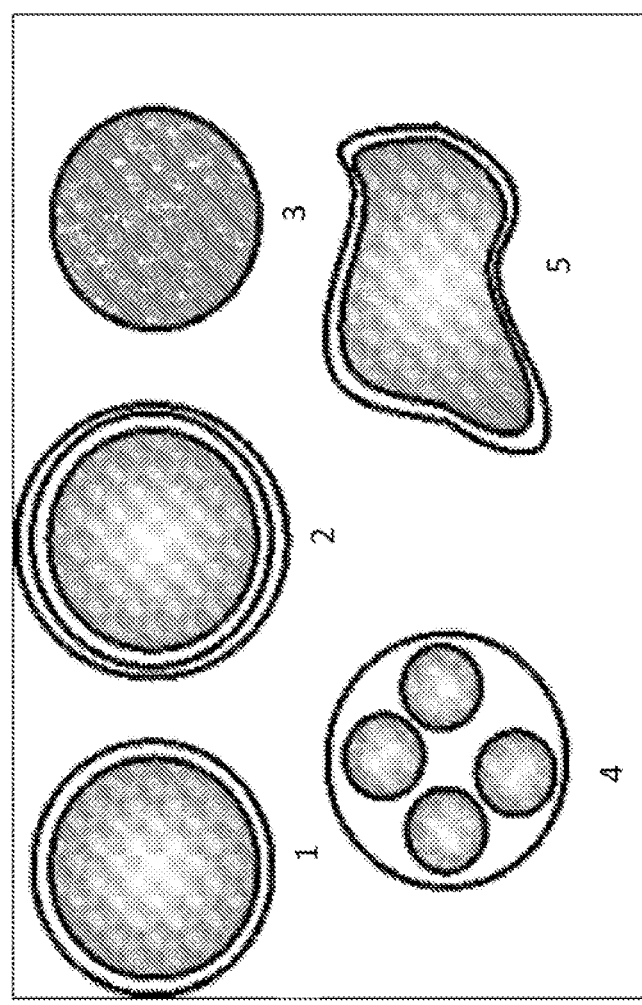
FIG. 3 is a view of microcapsules used in polishing pads of the present disclosure, in accordance with some embodiments.

One possible shape, configuration, and size of microcapsules is shown in FIG. 2A. However, any suitable shape (e.g., a sphere, an irregular shape, etc.), configuration, and size of microcapsules 180 can be used in a polishing pad 120 of the present disclosure. Various possible configurations and shapes are shown in FIG. 3. For example, a microcapsule may be a (1) single walled sphere, (2) a multi-walled sphere, (3) a matrix particle (i.e., the mixture of polymer material and photoinitiator is embedded in a matrix of the shell material), (4) a multi-cored particle (e.g., having two, three, four, or more cores), or (5) an irregular shape. In particular embodiments, each of the microcapsules is substantially spherical.

Returning to FIG. 2A, the size of the microcapsules may be chosen based on the intended use (e.g., the type of CMP, the nap thickness, etc.) of the polishing pad. In embodiments, the diameter of a microcapsule 180 is at least about 100 micrometers (μm). In some embodiments, the diameter of a microcapsule 180 is no more than about 1,000 μm. In some embodiments, the diameter ranges from about 100 μm to about 1,000 μm. In some embodiments, the diameter of a microcapsule 180 is at least about 10 nanometers (nm). In some embodiments, the diameter of a microcapsule 180 is no more than about 30 nm. In particular embodiments, the microcapsule diameter ranges from about 10 nm to about 30 nm. In embodiments, the surface contact area of a microcapsule 180 is at least about 100 μm². In some embodiments, the surface contact area of a microcapsule 180 is no more than about 10,000 μm². In particular embodiments, the surface contact area ranges from about 100 μm² to about 10,000 μm².

The size of the microcapsules, in turn, determines the capacity of the microcapsules to hold the mixture of polymer material and photoinitiator. Accordingly, the size of the microcapsules may be chosen based on the intended capacity of the microcapsules. In some embodiments, the capacity of each of the microcapsules is at least 10 microliters (μL). In particular embodiments, the capacity of each of the microcapsules is no more than about 1,000 μL. In various embodiments, the capacity of each of the microcapsules 180 ranges from about 10 μL to about 1000 μL. In specific embodiments, the capacity of each of the microcapsules is no more than about 100 μL. In specific embodiments, the capacity of each of the microcapsules is no more than about 50 μL. In various embodiments, the capacity of each of the microcapsules 180 ranges from about 10 μL to about 50 μL.

Further, microcapsules may be distributed in a variety of ways in the top pad of a polishing pad of the present disclosure. The density and/or size of the microcapsules can be chosen based at least in part on the thickness of the top pad. Generally, as the thickness of the top pad increases, the size of the microcapsules will also be increased in order to ensure the disk provides sufficient downward force to damage the shell of the microcapsules during the dressing process. In particular embodiments, where the thickness of the top pad ranges from about 50 mil to about 80 mil, the microcapsule size may range from about 10 μm to about 30 μm.

Similarly, in particular embodiments, the size of the microcapsules will increases through the thickness of the top pad of a polishing pad of the present disclosure from the polishing surface toward the platen. Further, the size, distribution, or both of the microcapsules may be selected at least in part based on the cutting rate of the disk during the dressing process. For example, in embodiments where the thickness of the top pad ranges from about 50 mil to about 80 mil, the microcapsule size may range from about 10 μm to about 30 μm, and the cutting rate of the disk ranges from about 120 μm/hour to about 260 μm/hour.

In some embodiments, the density of the microcapsules in the top pad (i.e., (the volume of the microcapsules)/(the total volume of the top pad and microcapsules)) and/or size of the microcapsules may be substantially constant throughout the thickness of the top pad of a polishing pad of the present disclosure. In some embodiments, the density of microcapsules in the top pad is at least about 10%. In some embodiments, the density of microcapsules in the top pad is no more than 90%. In various embodiments, the density of microcapsules in the top pad ranges from about 10% to about 90%. Generally, the overall all lifetime of a polishing pad of the present disclosure can be increased by increasing the density of the microcapsules.

Figure 4:
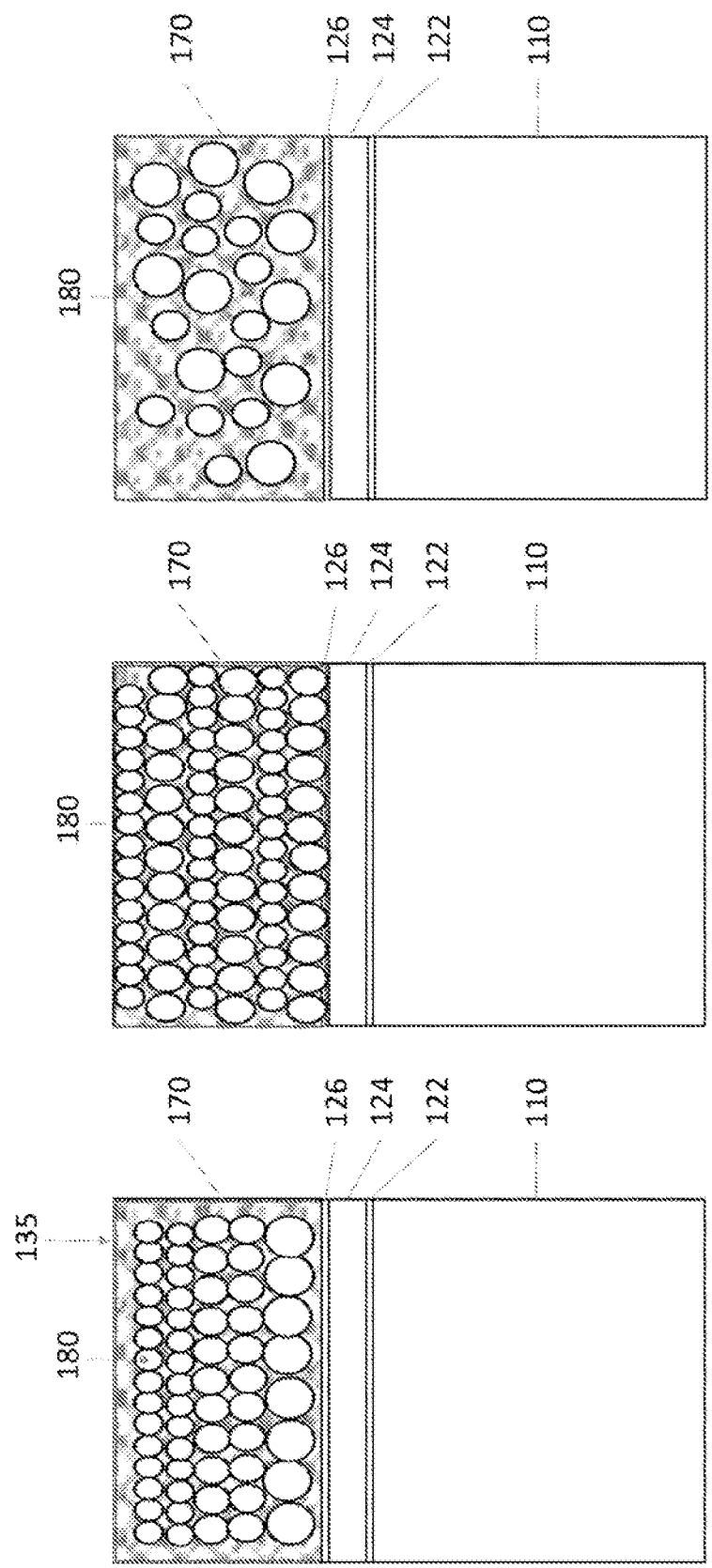
FIG. 4 is a cross-sectional view of various a polishing pads of the present disclosure, in accordance with some embodiments.

As shown in the middle of FIG. 4, the microcapsules 180 are arranged throughout the top pad in a regular pattern with a substantially constant density. In other embodiments, the size and/or density of the microcapsules 180 may vary in a substantially constant manner. As shown on the left in FIG. 4, the microcapsules 180 may be arranged such that the size increases from the polishing surface of a polishing pad 135 toward the platen 110.

In other embodiments, the size of the microcapsules in the top pad decreases from the polishing surface of the polishing pad 135 toward the platen 110. Additionally, the density of the microcapsules may vary through the thickness of the top pad. For example, the density may increase in the top pad from the outer surface of the polishing pad toward the platen. Alternatively, the density may decrease in the top pad from the outer surface of the polishing pad toward the platen.

In further embodiments, the density and/or size of the microcapsules vary in a random manner throughout the thickness of the top pad of a polishing pad of the present disclosure. For example, as shown on the right side of FIG. 4, the size and density of the microcapsules varies in an irregular manner through the thickness of the top pad.

Any suitable method of forming the microcapsules and polishing pads of the present disclosure may be used in order to achieve the desired characteristics of the microcapsules and the polishing pad. A variety of methods to form suitable microcapsules are known by one of skill in the art. For example, in order to form the microcapsules, the raw materials (i.e., the polymer materials and microcapsule solution) are blended (e.g., at a ratio of microcapsule solution to polymer material ranging from about 0.1 to about 3.0), cast, and cured to produce a plurality of microcapsules. In a particular example, the ratio of microcapsule solution to polymer material ranges from about 0.1 to about 1.0.

The microcapsules are then used to form a polishing pad of the present disclosure by combining the microcapsules with a liquid polymeric matrix material. In embodiments, a polishing pad of the present disclosure is formed by co-axial injection of the microcapsules and the liquid polymeric matrix material. The microcapsules and liquid polymeric matrix material are mixed, then agitated at a speed that is sufficient to control capsule distribution while being heated until properly cured. In embodiments, the mixture is agitated at a speed of at least about 1,500 revolutions per minute (rpm). In embodiments, the mixture is agitated at a speed of no more than about 3,000 rpm. In embodiments, the mixture is heated to a temperature of at least about 50° C. In some embodiments, the mixture is heated to a temperature of no more than about 100° C. In some embodiments, the mixture is cured for at least about 2 hours. In some embodiments, the mixture is cured for no more than about 4 hours. For example, the microcapsules and liquid polymeric matrix material are mixed at a temperature ranging from about 50° C. to about 100° C., for a period ranging from about 2 hours to about 4 hours, while being agitated at a speed ranging from about 1,500 rpm to about 3,000 rpm. Further, the mixture can be maintained at a pressure of about 1 atmosphere (atm) while being cured.

The resulting polishing pad with embedded microcapsules has a surface roughness and hardness that is comparable to a standard polishing pad (e.g., a polishing pad formed of the same polymeric material without the microcapsules). In some embodiments, the resulting surface roughness is at least about 2 μm. In embodiments, the resulting surface roughness is no more than about 10 μm. In embodiments, the resulting hardness is at least about 40, as measured by the Shore type D scale. In some embodiments, the resulting hardness is no more than about 85, as measured by the Shore type D scale. For example, the resulting surface roughness ranges from about 2 μm to about 10 μm, and the resulting hardness ranges from about 40 to about 85, as measured by the Shore type D scale.

Figure 2B:
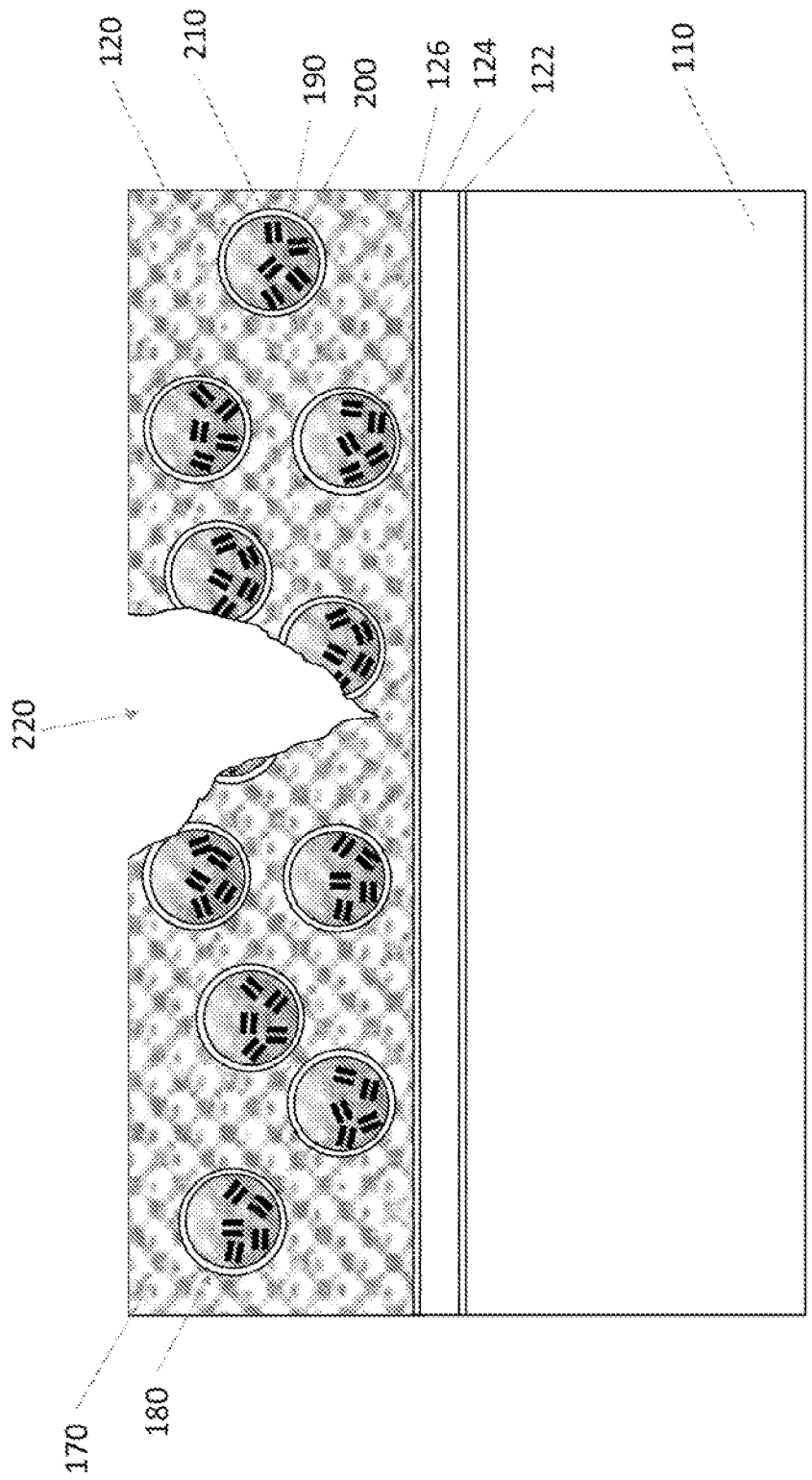

As described above, during the CMP process, a disk is used to dress the surface of the polishing pad 120. The disk presses downward on the polishing surface of the polishing pad, which dresses (i.e., damages) the polishing surface, as shown in FIG. 2B. The downward force of the disk during the dressing process is sufficient to break the shell of the microcapsule, but not so great to cause unnecessary damage to the polishing pad. In embodiments, the downforce of the disk is at least about 15 Newtons (N). In embodiments, the downforce of the disk is no more than about 30 N. In embodiments, the downforce of the disk ranges from about 15 N to about 30 N.

Figure 2C:
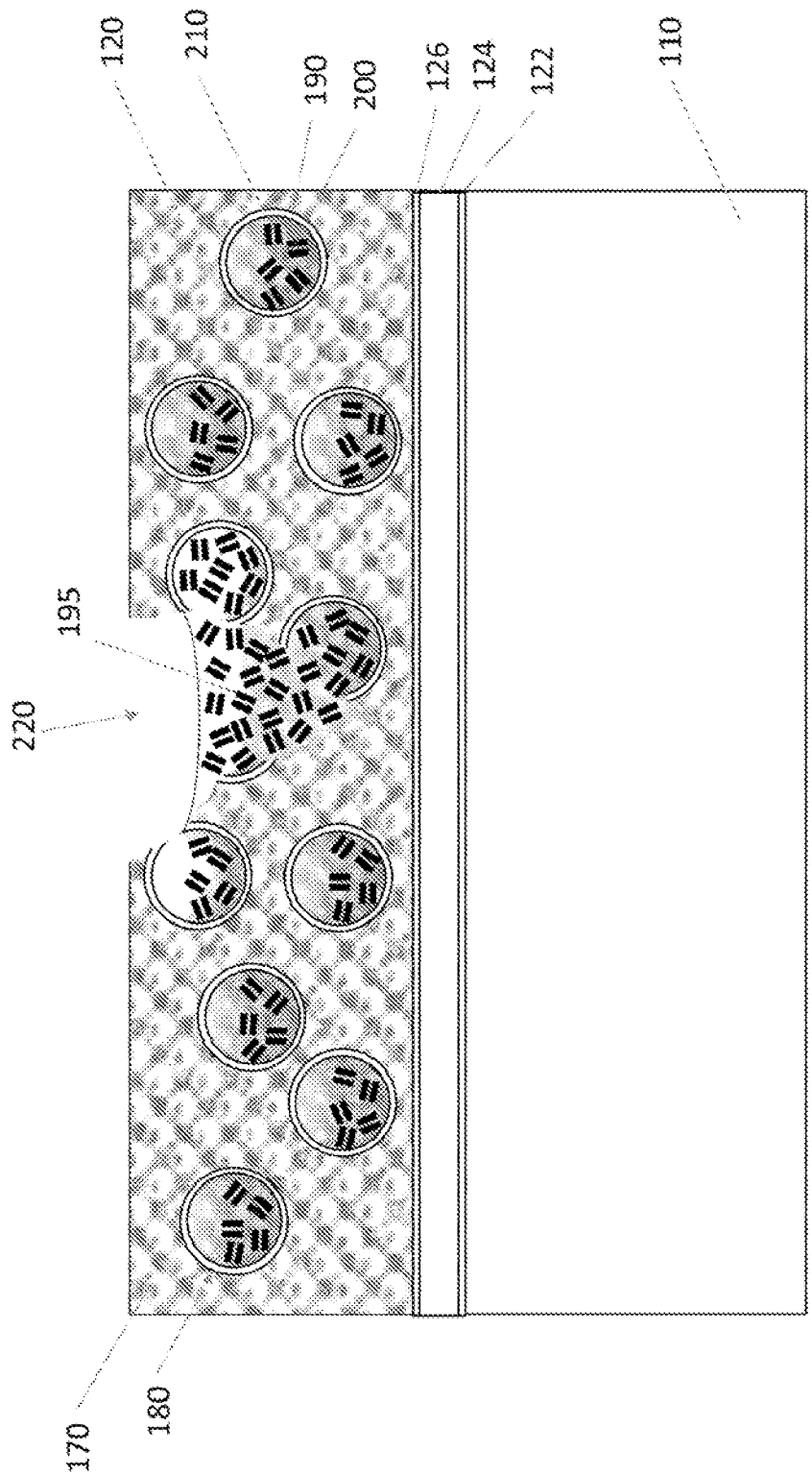

As the disk 150 is used to dress the surface of the polishing pad, the shells of the microcapsules in damaged area 220 of the polishing pad 120 are also damaged or otherwise altered such that polymer material 190 can escape the microcapsules. The polymer material 190 is released and flows out onto the damaged area 220 of the polishing pad 120, forming a pool of released polymer material 195, as shown in FIG. 2C.

Figure 2D:
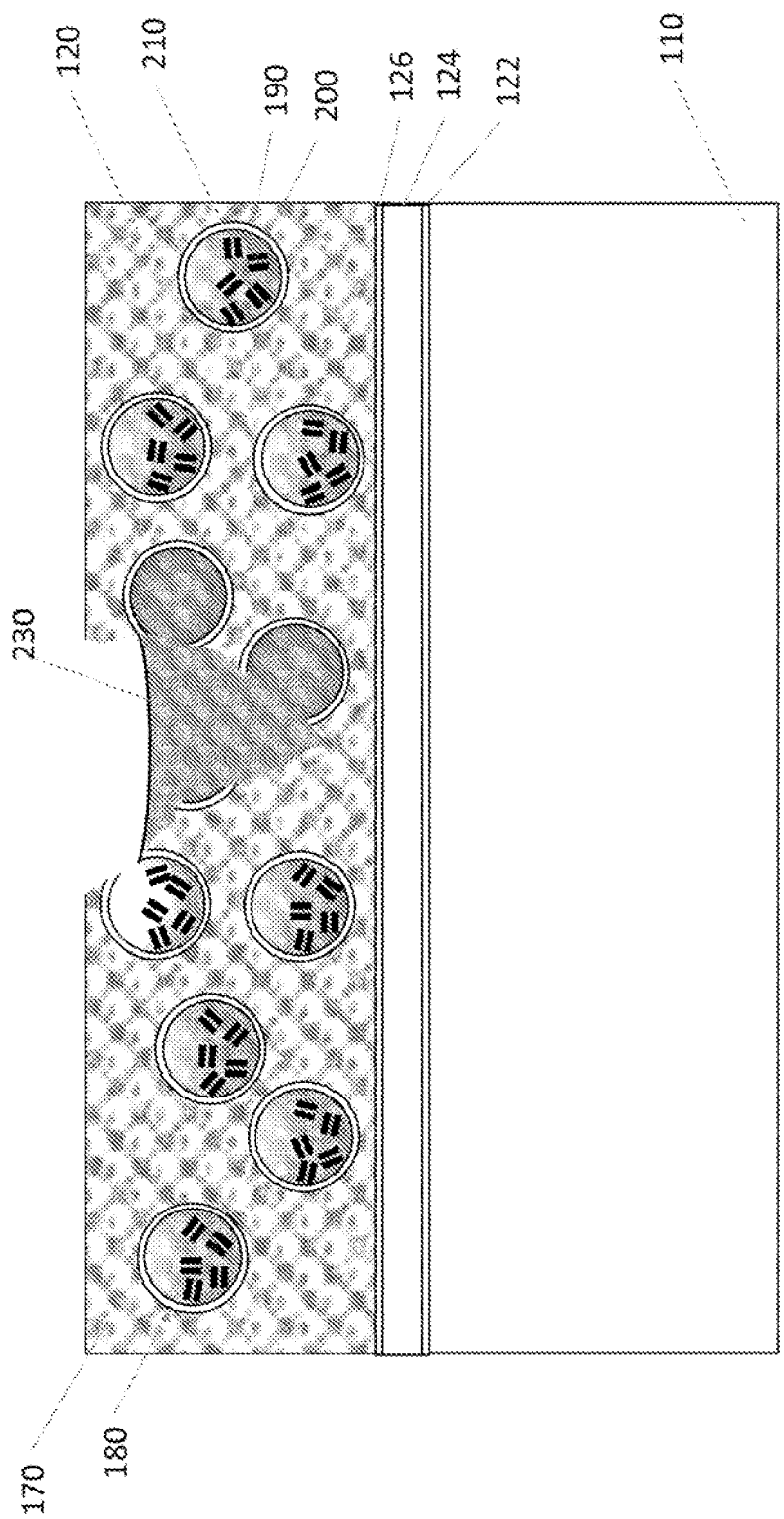

The damaged area 220 of the polishing pad 120 is then exposed to ultraviolet (UV) light resulting in polymerization of the released polymer material 195. The released polymer material 195 is at least partially cured to form a resultant polymer 230, thereby healing, e.g., partially filling in, the damaged area 220 of the polishing pad with polymer 230, as illustrated in FIG. 2D. In embodiments, the resultant polymer 230 is at least 75% cured. In further embodiments, the resultant polymer 230 is at least 90% cured. In particular embodiments, the resultant polymer 230 is at least 95% cured. In other words, exposing the released polymer material 195 to UV light initializes a polymerization reaction in the released polymer material 195 causing it to at least partially solidify in damaged area 220. In accordance with embodiments described above, the released polymer material 195 is cured by exposure to UV light; however, in accordance with embodiments of the present disclosure, the released polymer material can be selected from polymer materials that can be polymerized in other ways, including exposure to thermal energy, other types of electromagnetic energy, chemicals or environmental conditions.

As is understood, the structure of the resulting polymer 230 will depend on the polymer materials of the microcapsules. In some embodiments, the resulting polymer 230 has a linear structure. In other embodiments, the resulting polymer 230 has a branched structure. Further, a resulting polymer 230 may have a cross-linked structure. In some embodiments, the resulting polymer 230 has the same structure as the polymeric material of the top pad. In particular embodiments, the resulting polymer 230 is a polyamide, a polycarbonate, a polyester, a polyether ketone, a polyether, or a combination thereof.

The characteristics of the UV light (e.g., wavelength, intensity, illumination time, etc.) used to trigger photopolymerization of the mixture of the polymer material and the photoinitiator can be selected based on the particular mixture used. The characteristics may be chosen based on a minimum level of curing desired. For example, the UV light required to cure at least 90% of the polymer mixture. In embodiments, the UV light used to trigger photopolymerization of the mixture of the polymer material and photoinitiator has a wavelength ranging from 300 nanometers (nm) to 400 nm. In embodiments, the intensity of the UV light is at least about 1.0 mW/cm$^2$. In some embodiments, the intensity of the UV light is no more than about 5.0 mW/cm$^2$. In some embodiments, the intensity of the UV light ranges from about 1.0 mW/cm$^2$ to about 5.0 mW/cm$^2$.

The characteristics of the UV light may also be chosen based on the maximum illumination time desired. In embodiments, the illumination time is at least about 10 minutes. In some embodiments, the illumination time is no more than about 30 minutes. In particular embodiments, the illumination time ranges from about 10 minutes to about 30 minutes. In particular embodiments, a desired level of polymerization can be achieved using longer illumination times and lower levels of UV light intensity or shorter illumination times and higher levels of UV light intensity.

Although not shown in FIG. 1, a chemical-mechanical planarization system of the present disclosure includes a UV light source. Any suitable UV light source can be used to trigger photopolymerization of the mixture of the polymer material and photoinitiator, as long as it is capable of providing UV light at a sufficient intensity, with the proper wavelength, and for a sufficient amount of time, as discussed above.

Figure 5:
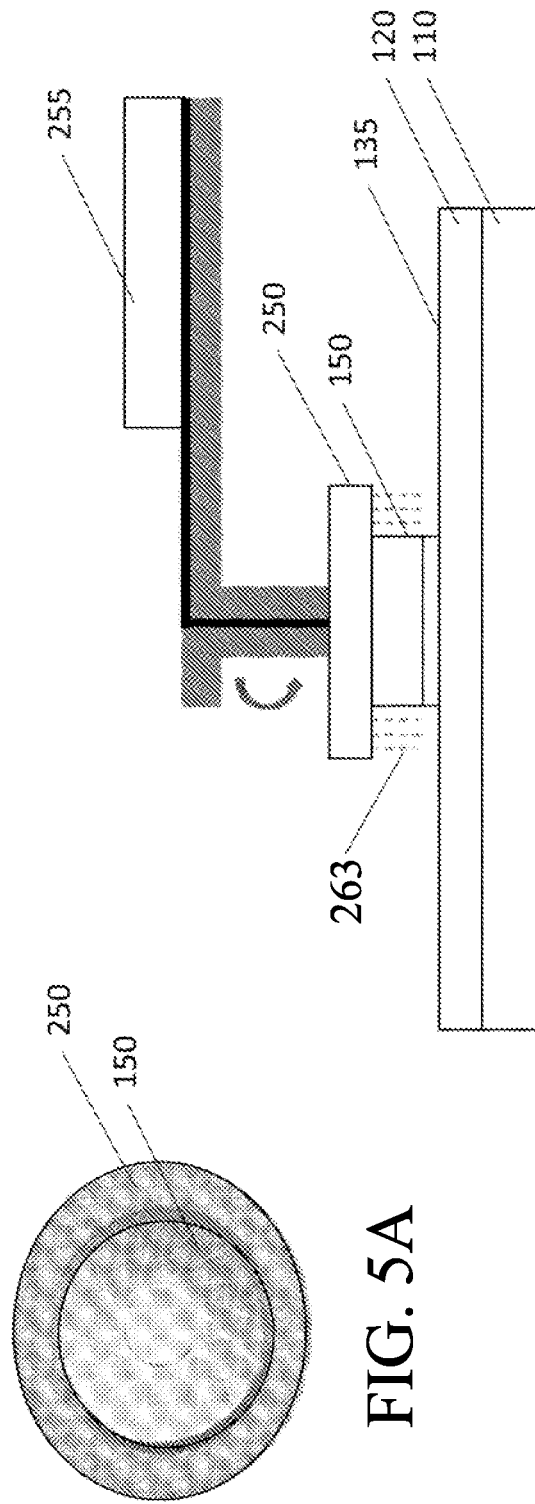
FIGS. 5A and 5B are perspective views of a chemical-mechanical polishing apparatus and UV light source, in accordance with some embodiments.

For example, as is schematically illustrated in FIG. 5A, the UV light source 250 is a ring light positioned around the disk 150. As illustrated in FIG. 5B, UV light source 250 is mounted concentrically around the disk 150, and a controller 255 is mounted on the arm that holds disk 150, and controls the UV light source 250. The UV light source 250, when activated, produces UV light 263 that is directed at the polishing surface 135 of the polishing pad 120. As described above, the disk 150 rotates and may move in other ways. The UV light source 250 may also rotate, or may be fixed around the disk 150.

The UV light source can be activated manually or automatically. For example, the UV light source can be activated periodically based on the number of wafers that have been polished (e.g., after 50 wafers have been polished, after 100 wafers have been polished, etc.), or after a predetermined amount of time (e.g., every hour, every six hours, every 12 hours, etc.).

In other embodiments, the UV light source can be activated upon detection of damage to the polishing pad. In some embodiments, the UV light source includes a UV light tracking device. In embodiments, the UV light source is fixed, meaning that the area at which the UV light is aimed does not change. In other embodiments, the UV light source is dynamic, meaning that the area at which the UV light is aimed, an angle at which the UV light is transmitted, or the position of the UV light can be changed, such that a specific area of the polishing pad can be targeted.

Figure 6:
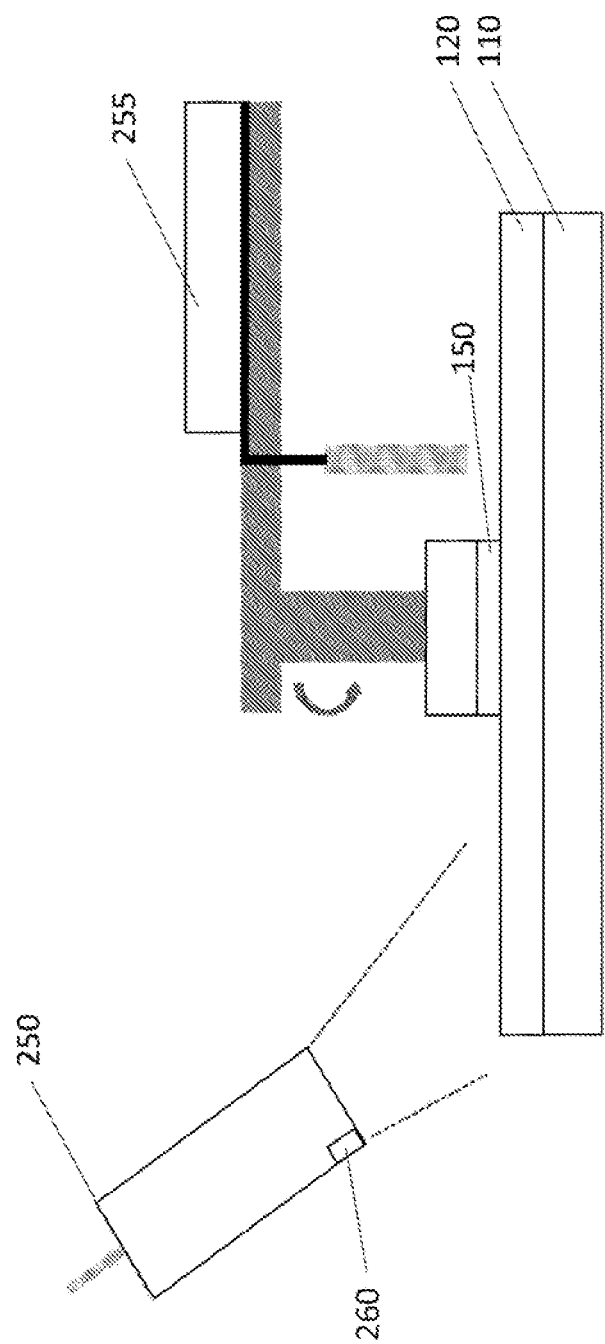
FIG. 6 is a perspective view of a chemical-mechanical polishing apparatus and UV light source, in accordance with some embodiments.

In one such embodiment, the UV light source 250 is a spotlight and a UV light targeting device 260 is a UV sensor, as shown in FIG. 6. A UV sensor mounted near the UV light source 250 is used to detect a relative low points (e.g., points that are physically lower), which correspond to damaged areas of the polishing pad 120. The UV light source 250 is then aimed at the relative low point and activated, the intensity is increased, or both. In particular embodiments, the UV light source 250 is aimed at a relative low point in the polishing pad and activated at maximum intensity. In embodiments where the UV light source 250 can be aimed at a relative low point, the UV light source can be directed at an angle ranging from 0 degrees to 45 degrees. Although the UV light targeting device is described as detecting relative low points, similar systems could be used that detect differences in any suitable characteristic (e.g., reflectivity of the surface, etc.) that indicates a damaged area of the polishing pad.

Figure 7:
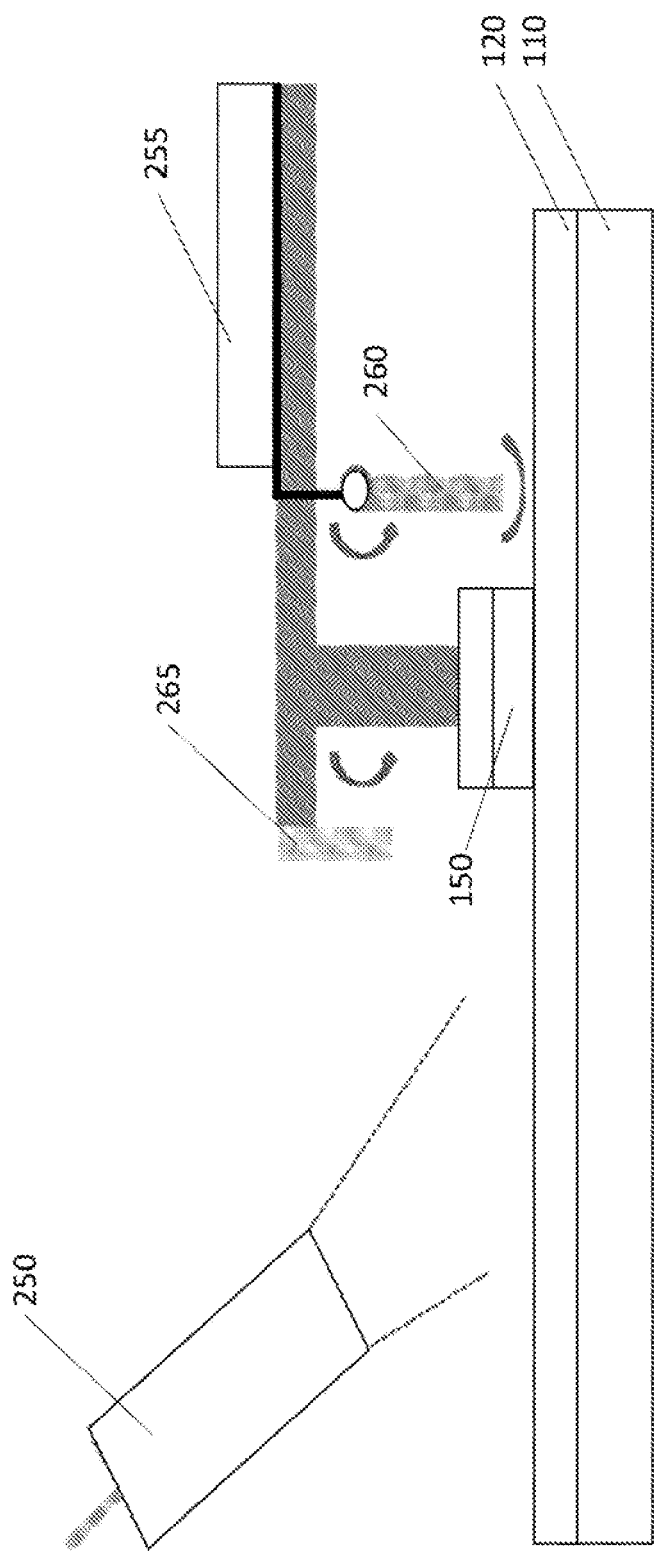
FIG. 7 is a perspective view of a chemical-mechanical polishing apparatus and UV light source, in accordance with some embodiments.

In another such embodiment, the UV light targeting device 260 includes a camera that is used to detect an area in need of repair and a controller that causes the UV light source to expose the area in need of repair, as shown in FIG. 7. The camera is mounted on a joint that allows it to move in order to monitor at least a portion of the entire surface of the polishing pad. The camera transmits information regarding location of an area in need of repair to the controller 255, which uses the information to re-directs the UV light source 250 toward the area in need of repair and activate the UV light source 250.

In some embodiments, such as the embodiment of FIG. 7, a second UV light targeting device 265 is present. As shown in FIG. 7, the second UV light targeting device 265 includes a charge coupled device (CCD) camera that is used to detect an area in need of repair and a controller (not shown) that causes the UV light source to expose the area in need of repair. In other embodiments, the controller 255 of the first UV light targeting device 260 is coupled to both the camera of the first UV light targeting device 260 and the CCD camera of the second UV light targeting device 265. In either embodiment, the CCD camera transmits information regarding regions in which the wear of the pad is higher than in a surrounding area or than a threshold amount to the controller 255 or to a second controller (not shown), which uses the information to activate the UV light source 250. In some embodiments, the information from CCD camera is further used to re-direct the UV light source 250 toward the area in need of repair.

In any of the above embodiments, the UV light source is positioned a suitable distance from the polishing pad such that the UV light source provides sufficient intensity of UV light to trigger polymerization of the mixture of the polymer material and photoinitiator. In embodiments, the UV light source is positioned at least about 10 centimeters (cm) from the surface of the polishing pad. In some embodiments, the UV light source is positioned no more than about 30 cm from the surface of the polishing pad. In particular embodiments, the UV light source is positioned in a distance ranging from about 10 cm to about 30 cm.

By healing the polishing pad in the manner described herein, the polishing pad has a longer pad lifetime than a standard polishing pad (e.g., a polishing pad using the same polymeric material and having the same nap thickness). Thus, a polishing pad of the disclosure may be used to polish more pieces with substantially the same polishing efficiency than a standard polishing pad (e.g., a polishing pad using the same polymeric material and having the same nap thickness).

Additionally, the polishing pads described herein have a more stable (i.e., less variable) polishing efficiency than a standard polishing pad (e.g., a polishing pad using the same polymeric material and having the same nap thickness). In other words, embodiments of the disclosure provide for a polishing pad that has a more stable remove rate than a standard polishing pad (e.g., a polishing pad using the same polymeric material and having the same nap thickness).

Accordingly, the pad lifetime is significantly increased and a stable, high removal rate is maintained for a longer period of time than for a standard polishing pad (e.g., a polishing pad using the same polymeric material and having the same nap thickness). In embodiments, a polishing pad of the present disclosure maintains a high polish efficiency (e.g., at least 1000 wafers). In embodiments, the removal rate of a polishing pad of the present disclosure is substantially stable (e.g., within a ratio of +/−0.05). In some embodiments, a polishing pad of the present disclosure can be used to polish at least 1000 wafers with a normalized removal rating of within +/−0.05.

Embodiments of the present disclosure include a polishing pad that includes a plurality of microcapsules dispersed in a matrix of polymeric material, where each microcapsule includes a polymer material and a shell around the polymer material.

Further embodiments of the present disclosure include a CMP system that includes a UV light source and a polishing pad that includes a porous polymeric material in which a plurality of microcapsules are embedded, where each microcapsule comprises a polymer material and a shell around the polymer material.

Additional embodiments of the present disclosure include a method that includes polishing a wafer with a polishing pad that includes a plurality of microcapsules embedded in a porous material, where each microcapsule includes a polymer material and a shell around the polymer material; releasing the polymer material from at least one of the microcapsules; and polymerizing the polymer material by exposing it to UV light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical-mechanical planarization (CMP) system, comprising a polishing pad, the polishing pad comprising:
   a matrix of polymeric material; and
   a plurality of microcapsules dispersed in the matrix of polymeric material, each microcapsule of the plurality of microcapsules comprising:
   a mixture comprising a polymer material and a photoinitiator; and
   a shell around the mixture.

2. The CMP system of claim 1, wherein the shell comprises $SiO_2$, $Al_2O_3$, $TiO_2$, or a combination thereof.

3. The CMP system of claim 2, wherein the shell has a thickness ranging from about 2 μm to about 5 μm.

4. The CMP system of claim 1, wherein the polymer material comprises urea-bidentate, urea-monodentate, urethane, urethane ether, or a combination thereof.

5. The CMP system of claim 1, wherein the polishing pad has a nap thickness ranging from about 0.5 millimeters (mm) to about 3 mm.

6. The CMP system of claim 1, wherein each microcapsule of the plurality of microcapsules is substantially spherical.

7. The CMP system of claim 1, wherein the plurality of microcapsules is arranged in a top pad of the polishing pad, and wherein a density of the plurality of microcapsules in the top pad ranges from about 10% to about 90%.

8. The CMP system of claim 1, wherein each microcapsule of the plurality of microcapsules contains from about 10 microliters (μL) to about 50 μL of the mixture.

9. The CMP system of claim 1, wherein each microcapsule of the plurality of microcapsules has a surface contact area ranging from about 100 μm$^2$ to about 10,000 μm$^2$.

10. A chemical-mechanical planarization (CMP) system, comprising:
    a polishing pad having a polishing surface and comprising:
    a porous polymeric material; and
    a plurality of microcapsules in the porous polymeric material, each microcapsule of the plurality of microcapsules comprising:
    a polymer material;
    a photoinitiator dispersed in the polymer material; and
    a shell around the polymer material; and
    an ultra-violet (UV) light source.

11. The CMP system of claim 10, further comprising a polishing pad conditioning disk arranged over the polishing surface of the polishing pad.

12. The CMP system of claim 11, wherein the UV light source is arranged concentrically relative to the polishing pad conditioning disk.

13. The CMP system of claim 10, further comprising a controller, which, in operation, controls one or more of a position of the UV light source relative to the polishing pad and a transmission intensity of the UV light source.

14. The CMP system of claim 10, wherein the UV light source is configured to be repositioned such that UV light produced can be directed toward a targeted area of the polishing surface of the polishing pad.

15. The CMP system of claim 10, further comprising a UV sensor, which, in operation, detects a damaged area of the polishing pad.

16. A chemical-mechanical planarization (CMP) system, comprising:
    a platen;
    a polishing pad over the platen, comprising:
    a sub pad; and
    a top pad over the sub pad and comprising a porous material and a plurality of microcapsules dispersed in the porous material, each microcapsule of the plurality of microcapsules comprising a mixture of a photopolymeriable material and a photoinitiator and a shell around the mixture; and
    a disk over the polishing pad and configured to condition a polishing surface of the top pad.

17. The CMP system of claim 16, wherein the polishing pad further comprises an adhesive layer between the sub pad and the top pad that couples the top pad to the sub pad.

18. The CMP system of claim 16, wherein the shell has a thickness ranging from 2 μm to 5 μm.

19. The CMP system of claim 16, wherein the photopolymeriable material comprises urea-bidentate, urea-monodentate, urethane, urethane ether, or a combination thereof.

20. The CMP system of claim 16, wherein the plurality of microcapsules is arranged in the top pad such that a size of the plurality of microcapsules increases through a thickness of the top pad from the polishing surface towards the sub pad.

* * * * *